(12) United States Patent
Bill et al.

(10) Patent No.: US 7,443,712 B2
(45) Date of Patent: Oct. 28, 2008

(54) MEMORY ERASE MANAGEMENT SYSTEM

(75) Inventors: Colin Bill, Cupertino, CA (US); Mark McClain, San Diego, CA (US); Michael VanBuskirk, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 82 days.

(21) Appl. No.: 11/470,958

(22) Filed: Sep. 7, 2006

(65) Prior Publication Data

US 2008/0062739 A1 Mar. 13, 2008

(51) Int. Cl.
*G11C 11/00* (2006.01)
(52) U.S. Cl. ............. 365/148; 365/163; 365/204
(58) Field of Classification Search ........... 365/148, 365/163, 204
See application file for complete search history.

(56) References Cited

U.S. PATENT DOCUMENTS

| | | | |
|---|---|---|---|
| 6,545,287 B2 | 4/2003 | Chiang | |
| 6,950,347 B2 | 9/2005 | Kurata et al. | |
| 6,972,985 B2 | 12/2005 | Rinerson et al. | |
| 7,009,208 B2 | 3/2006 | Aratani et al. | |
| 7,038,935 B2 | 5/2006 | Rinerson et al. | |
| 2005/0201146 A1* | 9/2005 | Moore et al. | 365/163 |

* cited by examiner

*Primary Examiner*—Huan Hoang
(74) *Attorney, Agent, or Firm*—Mikio Ishimaru

(57) ABSTRACT

A memory erase management system is provided, including providing a resistive change memory cell, coupling a first line to the resistive change memory cell, coupling a line buffer to the first line, providing a charge storage device coupled to the line buffer, and performing a single pulse erase of the resistive change memory cell by discharging a current from the charge storage device through the resistive change memory cell.

20 Claims, 4 Drawing Sheets

MEMORY ERASE MANAGEMENT SYSTEM

TECHNICAL FIELD

The present invention relates generally to integrated circuit memory, and more particularly to a system for metal insulation metal (MIM) memory cells.

BACKGROUND ART

Modern electronics, such as smart phones, personal digital assistants, location based services devices, digital cameras, music players, servers, and storage arrays, are packing more integrated circuits into an ever shrinking physical space with expectations for decreasing cost. One cornerstone for electronics to continue proliferation into everyday life is the non-volatile storage of information such as cellular phone numbers, digital pictures, or music files. Numerous technologies have been developed to meet these requirements.

Moreover, in the coming years, electronic systems, especially portable systems, will demand even more nonvolatile memory with high density and very high writing throughput for data storage application as well as fast random access for code execution. The flexibility and cost make the non-volatile memory a widely utilized and mature technology for most non-volatile applications.

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lacks erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

One popular and low-cost non-volatile memory is called "NAND" memory which is partly distinguished from other non-volatile memories because of the series connection configuration of the memory cells. Typical NAND memory is good for data storage applications but not well suited for fast random access needed for program code storage.

NAND memory uses the Fowler-Nordheim tunneling current. Programming data to the NAND memory requires high voltage, such as at least 15 volts or typically 18 volts, to store charge in the floating gate. This high voltage requirement does not scale well to smaller semiconductor geometries. The smaller and thinner physical features in the smaller semiconductor geometry process cannot reliably tolerate the high voltage levels. These additional constraints adversely impact memory density, function, performance, cost, and reliability.

Other memory approaches uses a metal-insulator-metal (MIM) structure as part of the overall memory structure. The MIM element turns on and off figuratively analogous to a mechanical switch, as the applied voltage changes and information from the MIM type memory is derived by sensing current through the MIM element. Typically, MIM type memories store data in a manner defined by the "on" or "off" state of the MIM element. Thus, the MIM element is often referred to as a MIM switch cell serving as a current switch.

In a memory array utilizing the MIM switch cell, transistors, such as a metal oxide semiconductor field effect transistor (MOSFET), serve as a transfer gate allowing access to particular portions of the memory array. Typically, the MOSFETs are connected in series to MIM switch cells as in dynamic random access memory (DRAM) type cells. However, today's technology requires approximately 100 uA to program or erase the MIM switch cell. The current required may be as low as 10 uA depending on the material used for the MIM switch cell but generally more current is necessary. Thus, the MOSFET must be designed large enough to conduct the current creating a large cell size, causing a reduction in memory density.

Resistance changing memories, including MIM memory and phase change memory, require a relatively large current to switch the memory element. This requires relatively large size switch transistors, MOSFET, in the memory cell making the cell size large. Resistance changing memories pass the read current through the switching cell. This causes so called "read disturb" to destroy the stored data as it operates.

There is an additional concern with the erasing process, since too high a voltage or too much current can damage the memory cell. In order to perform an erase without damaging the memory cell a process of erase, verify, and repeat is used. This iterative approach helps to protect the individual memory cells, but severely restricts the performance of the memory array.

Thus, a need still remains for a memory system providing low cost manufacturing, improved yields, and reduced memory cost. In view of the ever-increasing need to save costs and improve efficiencies, it is more and more critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides a memory erase management system including providing a resistive change memory cell, coupling a first line to the resistive change memory cell, coupling a line buffer to the first line, providing a charge storage device coupled to the line buffer, and performing a single pulse erase of the resistive change memory cell by discharging a current from the charge storage device through the resistive change memory cell.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
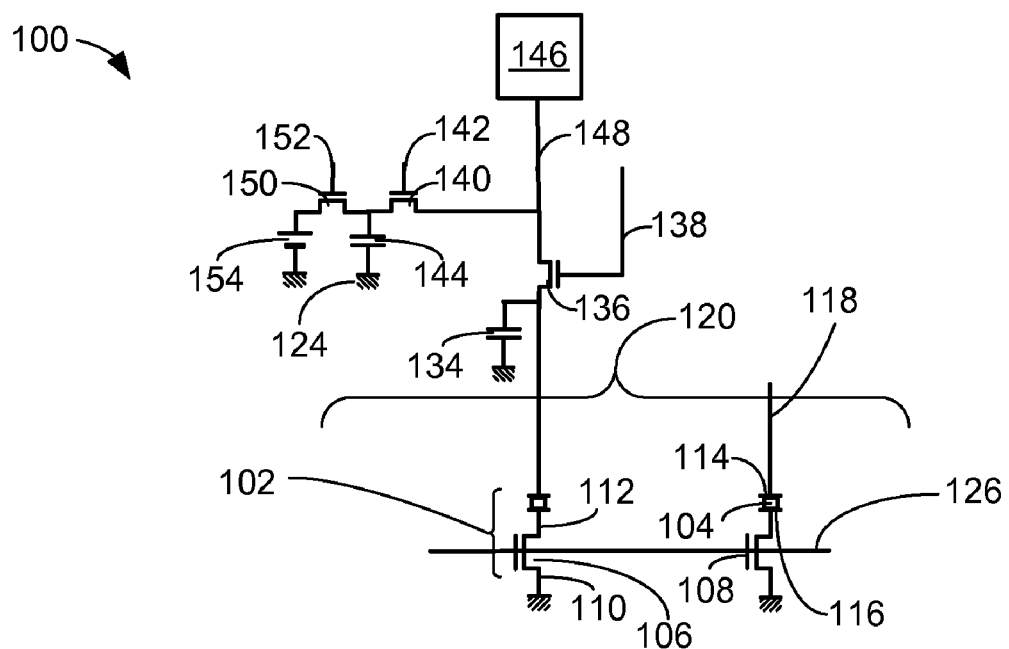
FIG. 1 is a detailed schematic view of a memory erase management system, in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure. The term "system" as used herein includes the apparatus and method of the present invention.

Referring now to FIG. 1, therein is shown a schematic view of a memory erase management system 100 in an embodiment of the present invention. The memory erase management system 100 includes resistive change memory cells 102 in an array configuration. Each of the resistive change memory cells 102 includes a switch cell 104, such as a phase change switch cell, or a MIM capacitor, and a cell transistor 106. The cell transistor 106, such as a junction field effect transistor (JFET), includes a gate terminal 108, a source terminal 110, and a drain terminal 112.

The switch cell 104 may be phase change switch cell made from a number of possible materials, such as germanium selenium tellurium (GeSeTe), germanium antimony tellurium (GeSbTe), or silver indium antimony tellurium (AgInSbTe), or another chalcogenide semiconductor comprised of Ge, Si, Ag, In, Sn, Sb, Te, Se, As, Bi, or the like is used. The switch cell 104 may alternatively be a MIM switch cell made from a number of possible materials, such as copper oxide ($Cu_xO$), nickel oxide (NiO), tantalum oxide ($Ta_2O_5$), or titanium oxide ($TiO_2$), between conductive plates, such as metals or alloys.

The switch cell 104 includes a first side 114 and a second side 116. The first side 114 connects to first lines 118, such as bit lines. The second side 116 connects to the drain terminal 112 of the cell transistor 106. The switch cell 104 may maintain a high resistance state when erased and a low resistance state when written or programmed. In some applications, programming multiple discrete resistance steps may be possible. These discrete resistance steps may represent multiple bits of information.

The memory erase management system 100 includes blocks 120 of the first lines 118, which connect to each of the blocks 120. Each of the blocks 120 includes a reference source 124, such as a ground, a voltage source, or a reference voltage. Second lines 126, such as word lines, as an example, thirty two per each of the blocks 120, enable an operation, such as read, write, or erase, to the selected word within the blocks 120.

Each of the first lines 118 has a characteristic capacitance represented by a first line capacitor 134 coupling the first lines 118 to the reference source 124. A first line select transistor 136, such as a bit line select transistor, acts as a low resistance decoding device. The first line select transistor 136 is used to enable the first lines 118 for an operation, such as read, write, or erase. The first line select transistor 136 may be activated by a first line enable 138 attached to the gate terminal of the first line select transistor 136. A line buffer 140, such as a transistor, is activated by a write/erase select line 142. When the line buffer 140 is activated it couples a charge storage device 144, such as a capacitor, on to the first lines 118. The charge storage device 144 dumps its charge through the switch cell 104, delivering a controlled amount of current for an erase operation. Controlling the amount of current dumped through the switch cell 104 provides a better controlled amount of generated heat. This is very important in the switch cell 104, because the erase mechanism is Joule heat. If too much heat is generated in the switch cell 104, it may be damaged. Generating too little heat in the switch cell 104 may leave the switch cell 104 stuck in a partially erased state whereby completing the erase is not possible.

The amount of current needed to perform a single pulse erase operation on the switch cell 104 may be determined by a read circuit 146 performing a read operation prior to the erase. A read of the first lines 118 through a selected read line 148 may determine the programmed resistance value, $R_{pgm}$, of the switch cell 104. The charge storage device 144 may be pre-charged with substantially the correct amount of charge to completely erase the switch cell 104. With the write/erase select line 142 negated the line buffer 140 isolates the charge storage device 144 from the first lines 118. A write/charge buffer 150, such as a transistor, is activated by a program select line 152. When activated, the write/charge buffer 150 passes current from a voltage source 154, which may supply a variable voltage to the charge storage device 144 dependent upon the programmed resistance value. When the charge storage device 144 has stored the substantially correct amount of charge, the program select line 152 is negated once again isolating the charge storage device 144.

By asserting the write/erase select line 142, the line buffer 140 is activated. The activation of the line buffer 140 allows the charge storage device 144 to discharge through the first lines 118 and the switch cell 104. The rapid discharge through the switch cell 104, in a single pulse erase, provides a temperature increase that causes the resistance value of the switch cell 104 to increase to an initial un-programmed value, $R_0$.

For illustrative purpose, the switch cell 104 is shown as a resistive changing device, such as a phase change cell or MIM resistive change cell. Also for illustrative purposes, the configuration of the memory erase management system 100 may have the number of the first lines 118 and the number of the second lines 126 in each of the blocks 120 are 32 and 1024, respectively, although it is understood that the number may be significantly different for both.

Figure 2:
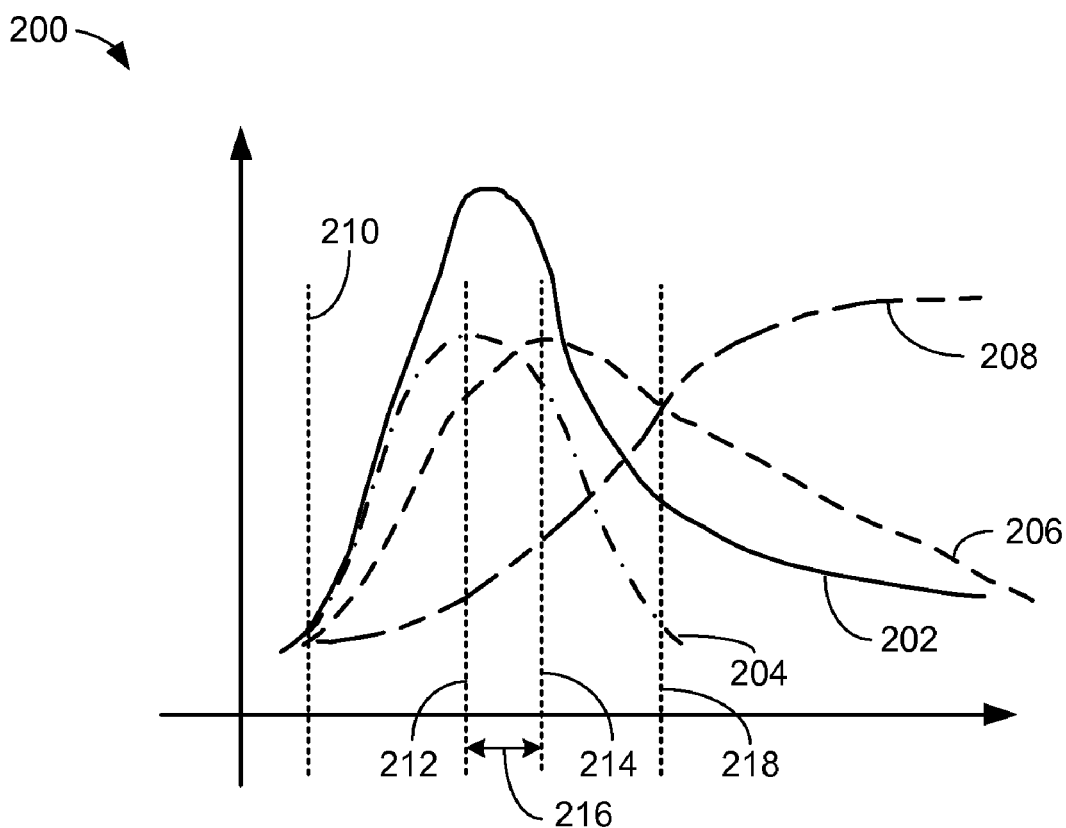
FIG. 2 is a graph of the internal characteristics of the switch cell, of FIG. 1, in a single pulse erase operation.

Referring now to FIG. 2, therein is shown a graph of internal characteristics 200 of the switch cell 104, of FIG. 1, in a single pulse erase operation. The graph of the internal characteristics 200 depicts a plot of a voltage 202, indicating the voltage applied to the switch cell 104 during the single pulse erase operation. A plot of a current 204 that shows the magnitude and profile of current discharged through the switch cell 104. A plot of a temperature 206 indicating the increase in the temperature 206 within the switch cell 104. A plot of a resistance 208 shows the transition of the resistance 208 from the $R_{pgm}$ value to the un-programmed value $R_0$.

A first marker 210 indicates the initiation of the single pulse erase operation. The rapid discharge of the current 204 from the charge storage device 144, of FIG. 1, causes the voltage 202 to quickly climb to the peak level of $V_{erase}$. The full transition may take in the range of 5 nanoseconds (ns). A second marker 212 indicates the peak of the current 204 in the single pulse erase operation. The temperature 206 within the switch cell 104 lags the pulse of the current due to the thermal properties of the switch cell 104. A third marker 214 indicates the peak of the temperature 206 within the switch cell 104. A time delay 216 between the second marker 212 and the third marker 214 is achieved within a 2 ns range. Within the time delay 216 the resistance 208 has already started the transition to the un-programmed value, $R_0$. The voltage 202 starts a dramatic reduction by the third marker 214. This fall-off is caused because the charge storage device 144 is rapidly depleting the current 204 and the resistance 208 is continuing to increase. The increase in the resistance 208 is primarily due to the temperature 206. A fourth marker 218 indicates the point at which the full return to the un-programmed resistance $R_0$ is assured.

The temperature 206 peaks at the third marker 214 and starts a substantially linear decrease, while the resistance 208 continues to increase up to the un-programmed value, $R_0$. The rapid decay of the voltage 202 beyond the third marker 214 assures the switch cell 104 will be erased rather than be programmed to some intermediate level. The entire single pulse erase operation may be completed in a predetermined duration, in the range of 10-50 ns. The end of the erase is verified by performing a read operation after the discharge pulse.

Figure 3:
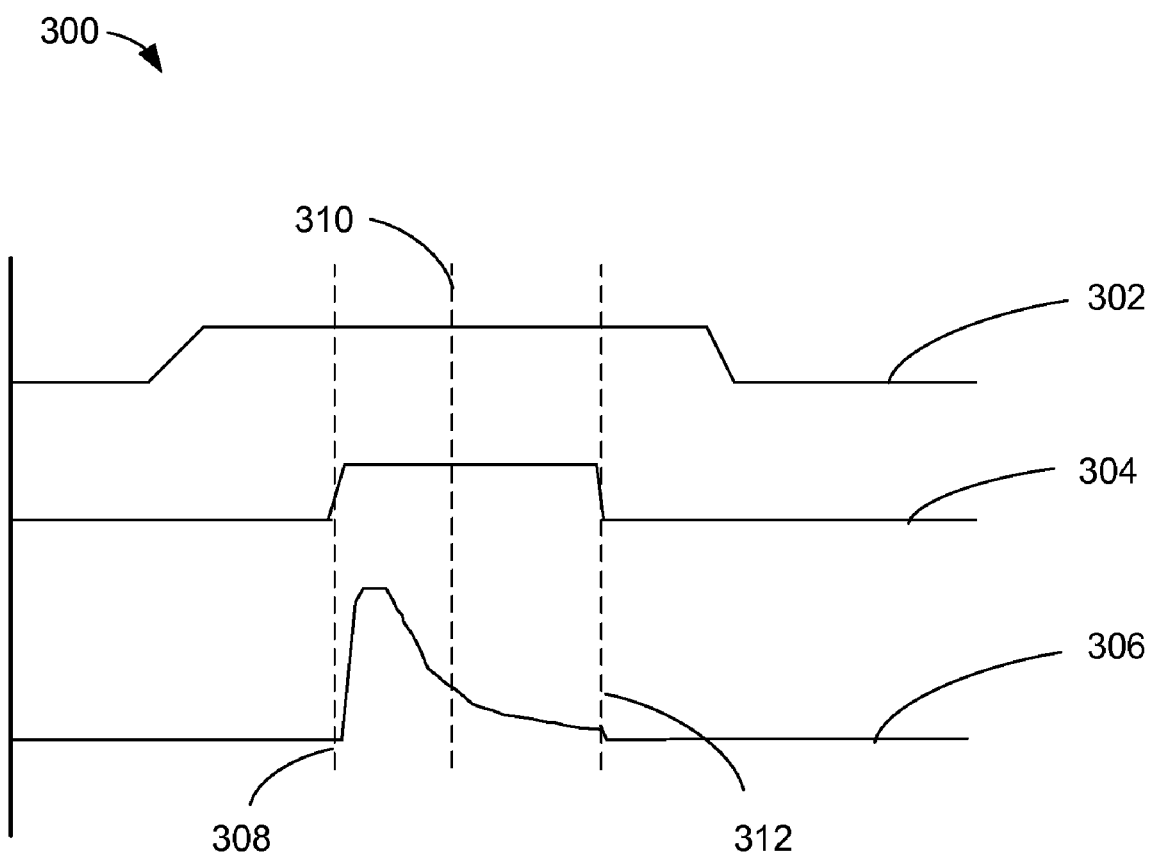
FIG. 3 is a waveform timing diagram of the control terms for the memory erase management system.

Referring now to FIG. 3, therein is shown a waveform timing diagram of control terms 300 for the memory erase management system 100. The waveform timing diagram depicts a second line signal 302, which enables the selected word while in the high state, a write/erase select line signal 304, which enables the single pulse erase process while in the high state, and a first line voltage waveform 306. A start marker 308 indicates the beginning of the single pulse erase process. An erase complete marker 310 indicates the point at which the switch cell 104, of FIG. 1, is erased to an initial resistance value, $R_0$. An end erase marker 312 indicates the single pulse erase operation is complete and the memory is ready for the next operation.

At the start marker 308 the write/erase select line signal 304 is asserted, which enabled the charge storage device 144, of FIG. 1, to discharge into the first lines 118, of FIG. 1. The first line voltage waveform 306 rises to $V_{erase}$ peak typically in about 5 nanoseconds (ns). The voltage decays as the charge storage device 144 is depleted. The erase complete marker 310 indicates the completion of the single pulse erase. The time interval between the start marker 308 and the erase complete marker 310 is typically in the range of 10-50 ns. At the end erase marker 312, the write/erase select line signal 304 is negated, which isolates the charge storage device 144 from the first lines 118.

Figure 4:
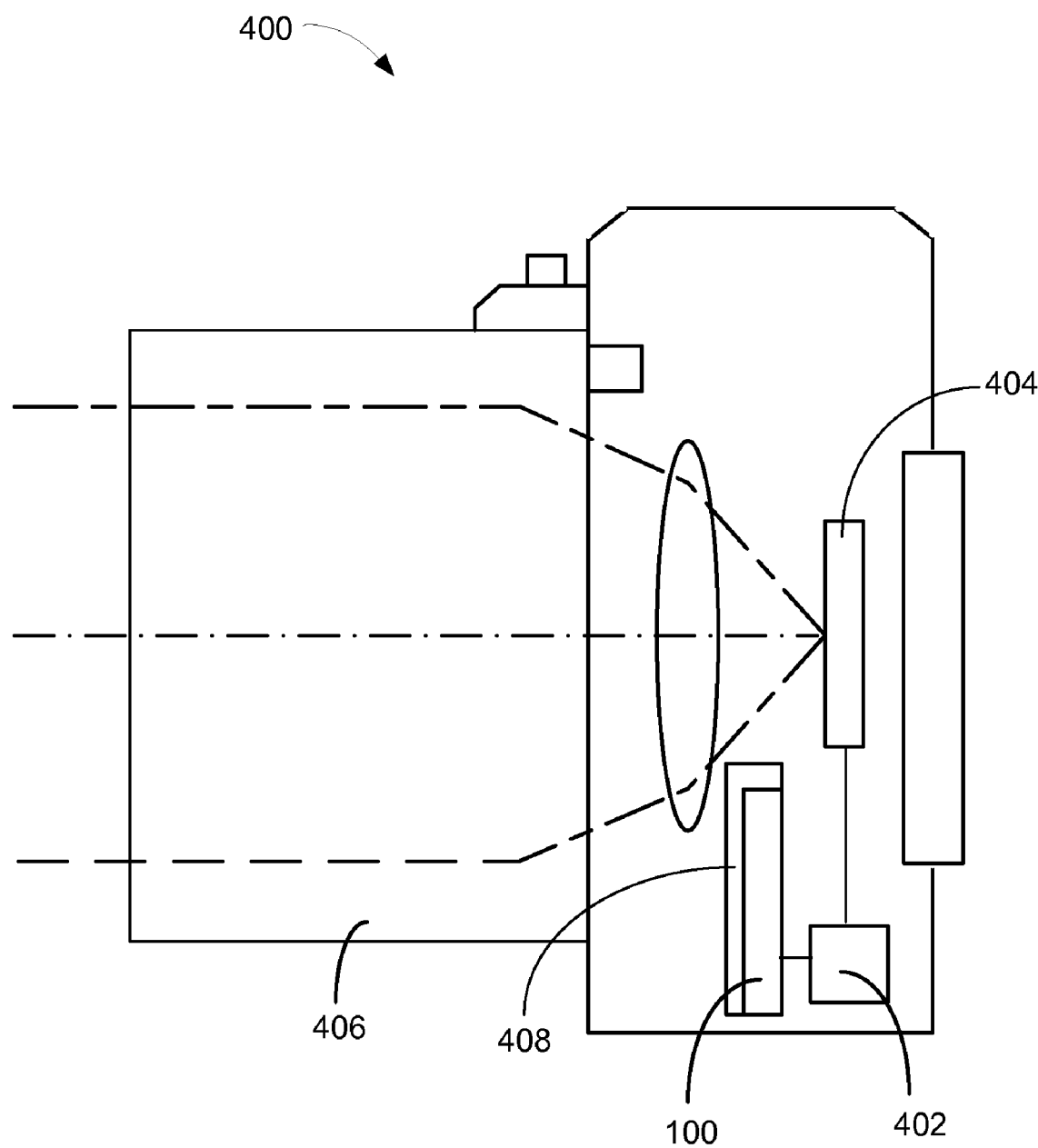
FIG. 4 is a block diagram view of an electronic assembly including a memory erase management system, of FIG. 1.

Referring now to FIG. 4, therein is shown a block diagram view of an electronic assembly 400 including the memory erase management system 100, of FIG. 1. The block diagram view of the electronic assembly 400, such as a camera system, depicts a controller 402, such as a microprocessor, coupled to an optical sensor 404 that receives an image from a lens assembly 406. A memory system 408 utilizing the memory erase management system 100 is coupled to the controller 402 for storing the images received from the optical sensor 404. In this embodiment, the memory erase management system 100 is a component in a non-volatile storage function for the electronic assembly 400.

For illustrative purposes, the memory erase management system 100 is shown in the electronic assembly 400, although it is understood that the memory erase management system 100 may be used in integrated circuits, as a device, and in other electronic assemblies, as well. Possible applications for the memory erase management system 100 may include the electronic assemblies 400, such as hand held games, personal audio/video players, personal data assistants (PDA's), cellular telephones, test equipment, computer equipment, and the like.

Figure 5:
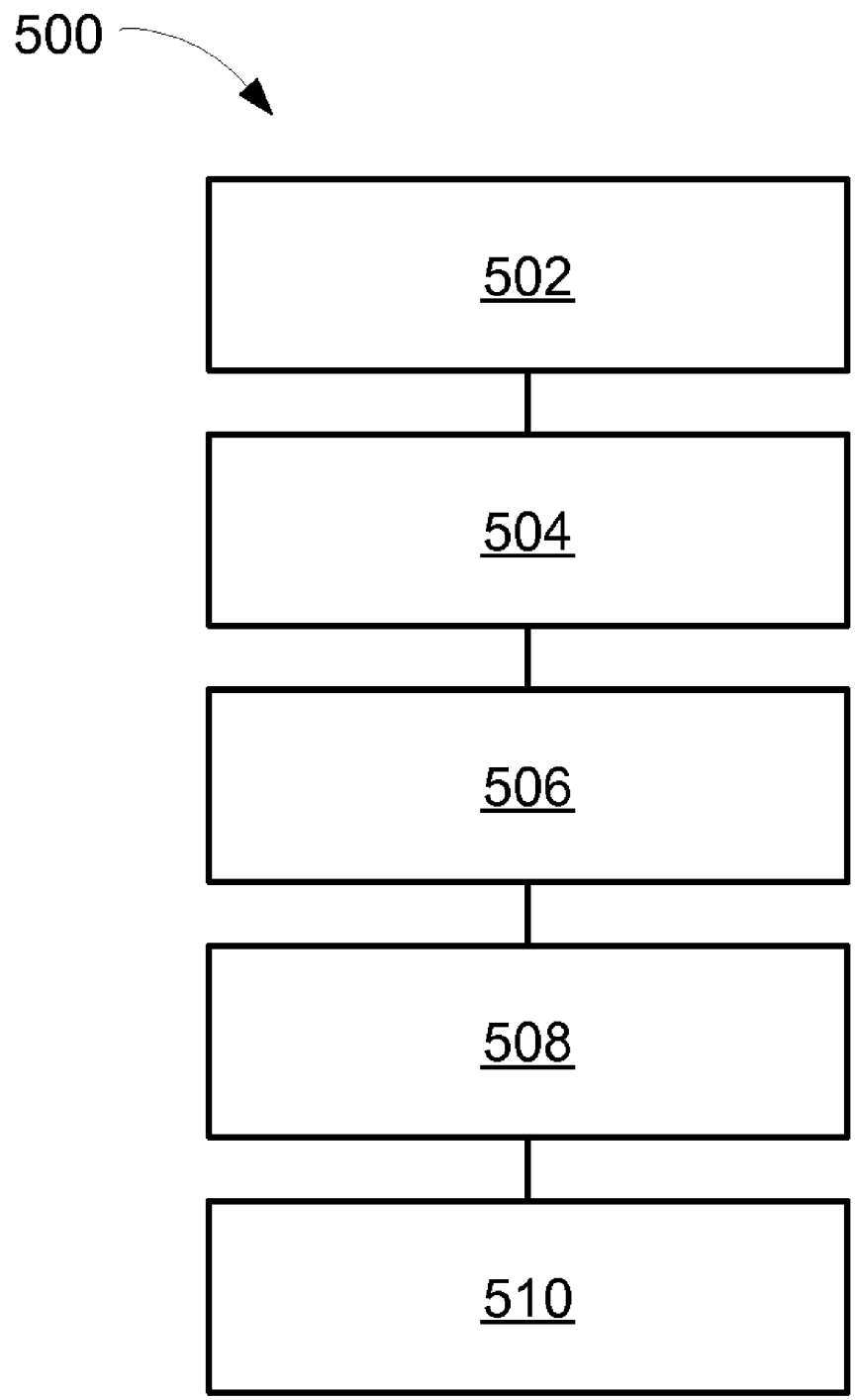
FIG. 5 is a flow chart of a memory erase management system for manufacturing a memory erase management system in an embodiment of the present invention.

Referring now to FIG. 5, therein is shown a flow chart of a memory erase management system 500 for manufacturing the memory erase management system 100, in an embodiment of the present invention. The system 500 includes providing a resistive change memory cell in a block 502; coupling a first line to the resistive change memory cell in a block 504; coupling a line buffer to the first line in a block 506; providing a charge storage device coupled to the line buffer in a block 508; and performing a single pulse erase of the resistive change memory cell by discharging a current from the charge storage device through the resistive change memory cell in a block 510.

In greater detail, a memory erase management system to manufacture a memory erase management system in an embodiment of the present invention is performed as follows:

1. Providing a resistive change memory cell, having a switch cell and a cell transistor. (FIG. 1)
2. Coupling a first line to the resistive change memory cell, including a first line select transistor. (FIG. 1)
3. Coupling an line buffer to the first line. (FIG. 1)
4. Providing a charge storage device coupled to the line buffer, includes providing a capacitor. (FIG. 1) and
5. Performing a single pulse erase of the resistive change memory cell by discharging a current from the charge storage device through the resistive change memory cell, including passing the current through the cell transistor. (FIG. 1)

It has been discovered that the present invention thus has numerous aspects.

It has been discovered that the present invention provides the connection of the memory erase management system, improves memory performance, lowers power consumption, increases reliability, and lowers cost of the memory system.

An aspect is that the present invention provides that the switch cell may be turned "on" by high voltage with low current and turned off by low voltage with high current. The voltage and current requirements are sufficiently low and scale with smaller semiconductor geometry processes. The single pulse erase is enabled by identifying the programmed resistance of the switch cell prior to the erase, then applying only the amount of current required to erase the bit.

Another aspect of the present invention is that addition of the memory erase management system may enhance reliability by assuring the appropriate amount of charge and heat is delivered to the switch cell without causing an over temperature condition or a partially programmed switch cell.

Yet another aspect of the present invention provides a mechanism to program multiple bits of information into a single memory cell. The ability to deliver a measured amount of current to adjust the resistance of the cell, creates the possibility of utilizing four different resistance settings to represent two bits of information, in combination, in a single memory cell and the ability to erase those different resistance levels back to a known initial resistance, $R_0$.

Yet another aspect of the present invention is that the voltage drops below the voltage required to program the cell before the erase is complete, thus assuring the switch cell is erased and not re-programmed.

Yet another aspect of the present invention has the performance for fast random access needed for program code storage. The lower voltage and current requirements allows the resistive change memory cells to respond faster than memory cells requiring device structures to tolerate higher voltage level, such as 18 volts.

Thus, it has been discovered that the memory erase management system and method of the present invention furnishes important and heretofore unknown and unavailable solutions, capabilities, and functional aspects for improving yield, reliability, scalability, and cost in systems. The resulting processes and configurations are straightforward, cost-effective, uncomplicated, highly versatile and effective, can be implemented by adapting known technologies, and are thus readily suited for efficiently and economically manufacturing stacked integrated circuit package-in-package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A memory erase management method comprising:
   providing a resistive change memory cell;
   coupling a first line to the resistive change memory cell;
   coupling a line buffer to the first line;
   providing a charge storage device coupled to the line buffer; and
   performing a single pulse erase of the resistive change memory cell by discharging a current from the charge storage device through the resistive change memory cell.

2. The method as claimed in claim 1 further comprising providing a voltage source for charging the charge storage device.

3. The method as claimed in claim 1 further comprising:
   providing a read circuit for reading a resistance from the resistive change memory cell;
   charging the charge storage device to a voltage indicated by the resistance read; and
   enabling a cell transistor by a second line includes discharging the current from the charge storage device through the resistive change memory cell.

4. The method as claimed in claim 1 wherein performing the single pulse erase on the resistive change memory cell is of a predetermined duration.

5. The method as claimed in claim 1 further comprising:
   forming a memory system utilizing the memory erase management system; and
   forming an integrated circuit or an electronic assembly with the memory system.

6. A memory erase management method comprising:
   providing a resistive change memory cell, having a switch cell and a cell transistor;
   coupling a bit line to the resistive change memory cell, including a bit line select transistor;
   coupling a line buffer to the bit line;
   providing a charge storage device coupled to the line buffer, includes providing a capacitor; and
   performing a single pulse erase of the resistive change memory cell by discharging a current from the charge storage device through the resistive change memory cell, including passing the current through the cell transistor.

7. The method as claimed in claim 6 further comprising providing a voltage source for charging the charge storage device, in which providing the voltage source includes supplying a variable voltage.

8. The method as claimed in claim 6 further comprising:
   providing a read circuit for reading a resistance from the resistive change memory cell, includes determining the programmed resistance value;
   charging the charge storage device to a voltage indicated by the resistance read includes determining the current needed to change the resistance of the resistive change memory cell; and
   enabling the cell transistor by a word line including discharging the current from the charge storage device through the resistive change memory cell for elevating a temperature in the switch cell.

9. The method as claimed in claim 6 wherein performing the single pulse erase on the resistive change memory cell is in the range of 10-50 nanoseconds in duration, including activating the line buffer.

10. The method as claimed in claim 6 wherein performing the single pulse erase includes elevating a temperature in the resistive change memory cell, including reducing a voltage during the single pulse erase.

11. A memory erase management system comprising:
    a resistive change memory cell;
    a first line coupled to the resistive change memory cell;
    a line buffer coupled to the first line;
    a charge storage device coupled to the line buffer in which the charge storage device having a current discharged through the resistive change memory cell in a single pulse erase of the resistive change memory cell.

12. The system as claimed in claim 11 further comprising a voltage source for charging the charge storage device.

13. The system as claimed in claim 11 further comprising:
    a read circuit for reading a resistance from the resistive change memory cell; and
    a cell transistor enabled by a second line with the current from the charge storage device discharged through the resistive change memory cell.

14. The system as claimed in claim 11 wherein the resistive change memory cell is for performing a single pulse erase in a predetermined duration.

15. The system as claimed in claim 11 further comprising:
    a memory system with the memory erase management system; and
    an integrated circuit or an electronic assembly with the memory system.

16. The system as claimed in claim 11 wherein:
    the resistive change memory cell having a switch cell and a cell transistor, and the cell transistor passes the current from the charge storage device;

further comprising:

a bit line select transistor coupled to the bit line; and a capacitor coupled to the line buffer.

17. The system as claimed in claim 16 further comprising a voltage source for charging the charge storage device, in which the voltage source includes a variable voltage supply.

18. The system as claimed in claim 16 further comprising:

a read circuit for reading a resistance from the resistive change memory cell, includes the programmed resistance value determined; and a word line for enabling the cell transistor with the current from the charge storage device discharged through the resistive change memory cell provides the switch cell having a temperature elevated.

19. The system as claimed in claim 16 wherein the switch cell in the resistive change memory cell changes states in the range of 10-50 nanoseconds in duration, includes the line buffer activated.

20. The system as claimed in claim 16 wherein the resistive change memory cell having the current from the charge storage device discharged through the resistive change memory cell for a temperature elevated, with a voltage reduced during the single pulse erase.

* * * * *